(12) United States Patent
Melby et al.

(10) Patent No.: US 8,016,599 B1
(45) Date of Patent: Sep. 13, 2011

(54) MAGNETIC JUMPER FOR BYPASSING ELECTRICAL CIRCUITS

(76) Inventors: Steve Melby, Newport, MN (US); Steve Fischer, Mahtomedi, MN (US)

( * ) Notice: Subject to any disclaimer, the term of this patent is extended or adjusted under 35 U.S.C. 154(b) by 0 days.

(21) Appl. No.: 12/924,365

(22) Filed: Sep. 27, 2010

Related U.S. Application Data

(60) Provisional application No. 61/341,339, filed on Mar. 30, 2010.

(51) Int. Cl.
*H01R 11/30* (2006.01)
(52) U.S. Cl. ......................................................... 439/38
(58) Field of Classification Search .................... 439/38, 439/507, 509, 510
See application file for complete search history.

(56) References Cited

U.S. PATENT DOCUMENTS

| | | | |
|---|---|---|---|
| 3,963,857 A * | 6/1976 | Reynolds et al. | 174/84 C |
| 4,112,941 A | 9/1978 | Larimore | |
| 4,211,456 A | 7/1980 | Sears | |
| 4,384,752 A | 5/1983 | Gabriel | |
| 4,719,549 A | 1/1988 | Apel | |
| 4,815,991 A | 3/1989 | Bakke | |
| 5,053,595 A | 10/1991 | Derbyshire | |
| 5,658,163 A * | 8/1997 | DeRoss | 439/424 |
| 6,565,363 B2 | 5/2003 | Downing | |
| 7,264,479 B1 | 9/2007 | Lee | |
| 7,467,948 B2 * | 12/2008 | Lindberg et al. | 439/38 |
| 7,637,746 B2 * | 12/2009 | Lindberg et al. | 439/38 |
| 7,762,817 B2 * | 7/2010 | Ligtenberg et al. | 439/38 |
| 2008/0067044 A1 | 3/2008 | Schwartzbart | |

OTHER PUBLICATIONS

Patch Cords and Test Leads, EDGE, Catalog [online], Oct. 15, 2006; http://www.shieldselectronics.com/ecats/testcat/patch.pdf.

* cited by examiner

*Primary Examiner* — Chandrika Prasad
(74) *Attorney, Agent, or Firm* — Thomas B. Tate

(57) ABSTRACT

A magnetic jumper for bypassing electrical circuits. The jumper includes a magnet at each end of a wire. Each magnet can be attached to a terminal of a low voltage electrical circuit in order to bypass that circuit for testing and troubleshooting purposes. The magnetic jumper works with almost any terminal that has steel screws.

10 Claims, 5 Drawing Sheets

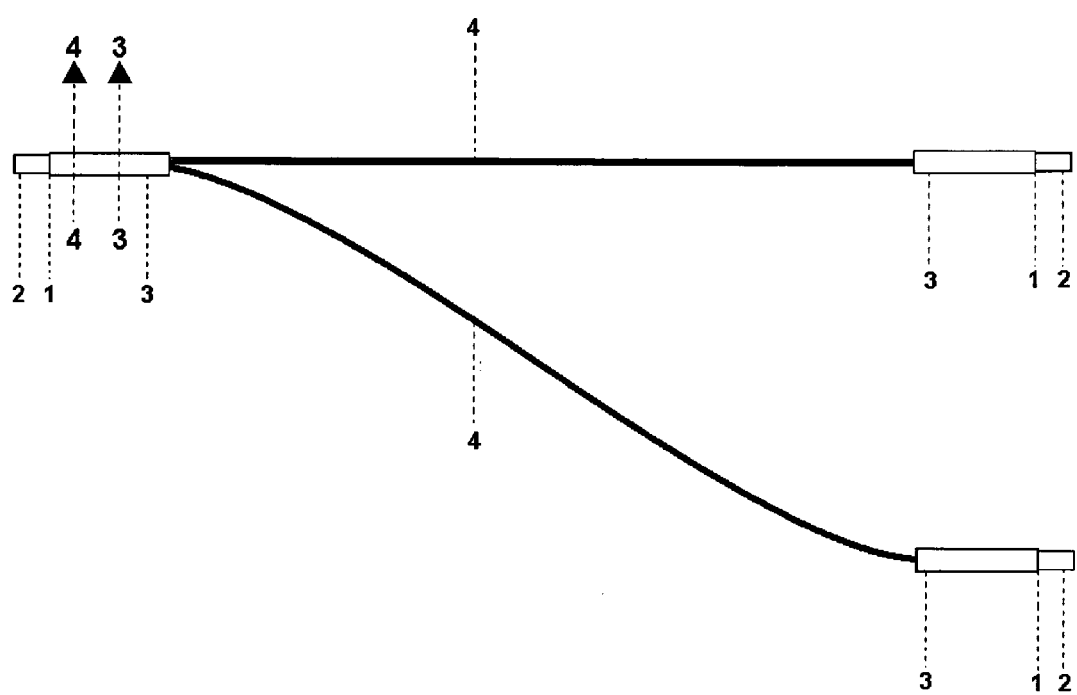

MAGNETIC JUMPER FOR BYPASSING ELECTRICAL CIRCUITS

This application claims the benefit of Provisional Patent Application No. 61/341,339, filed Mar. 30, 2010, which is incorporated by reference herein.

BACKGROUND OF THE INVENTION

Alligator clip jumpers are used today to clip onto terminals in order to bypass electrical circuits for testing and troubleshooting purposes. Alligator clips have several disadvantages. They pop off easily and cannot be clipped onto recessed terminals as are found on thermostat sub-bases, for example.

Also known in the prior art is a test lead for a meter, the test lead having only one magnetic end, in a flush configuration. This lead also cannot be used with recessed terminals.

No jumpers having magnets at both ends are known to exist in the prior art, and no prior art jumpers suitable for use with recessed terminals are known to exist.

SUMMARY OF THE INVENTION

The invention is a magnetic jumper for bypassing electrical circuits. The magnetic jumper is used to test electrical circuits by providing an alternate electrical path to bypass a switching device that has steel terminals or contact points. The magnetic jumper is a piece of wire that has a magnet at each end. The magnets attach to the terminals of the electrical circuit to be bypassed. This type of jumper has applications in many industries including heating, electrical, automotive, and electrical controls.

An advantage of the invention is that it is easier to use than prior art devices and adheres more securely to most types of terminals. The magnets do not stick to brass but adhere very well to steel. Approximately eighty percent of terminals today have steel screws.

Another advantage of the invention is that it works just as well with recessed terminals as with exposed terminals.

DESCRIPTION OF THE DRAWINGS

FIG. 5 is a side view of an alternative embodiment of the invention, showing a three-way jumper.

DETAILED DESCRIPTION OF THE INVENTION

Figure 1:
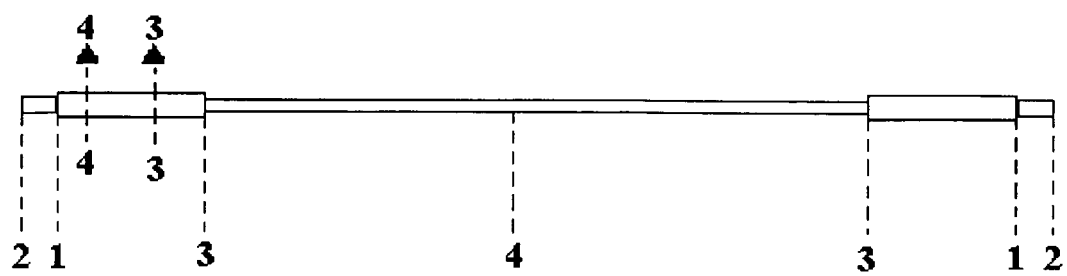
FIG. 1 is a side view of a preferred embodiment of the invention.

The magnetic jumper comprises a wire 4 having a magnet 2 at each end. A neodymium magnet 2 is pressed into a brass barrel 1 that is crimped over a single conductor multi-strand wire 4 that has a copper conductor 5 folded over within the wire 4. A magnet 2 is attached in this manner at each end of the wire 4. A means 3 for non-conduction of electricity is provided at each end of the wire 4. The non-conductive means 3 can be any of several alternatives. The non-conductive means 3 can be a molded end of vinyl, silicon, or other non-conductive material, which can be made by injection molding. Alternatively, the non-conductive means 3 can be a heat-shrink tube fitted over the brass barrel 1 at each end of the wire 4, leaving the magnet 2 exposed. In still another alternative, the non-conductive means 3 can be a dipped vinyl coating or other non-conductive coating at each end of the wire 4, the coating covering the barrel 1 and a part of the wire 4 that extends from the barrel 1 at the opposite end of barrel 1 from magnet 2 as seen in FIG. 2.

Figure 2:
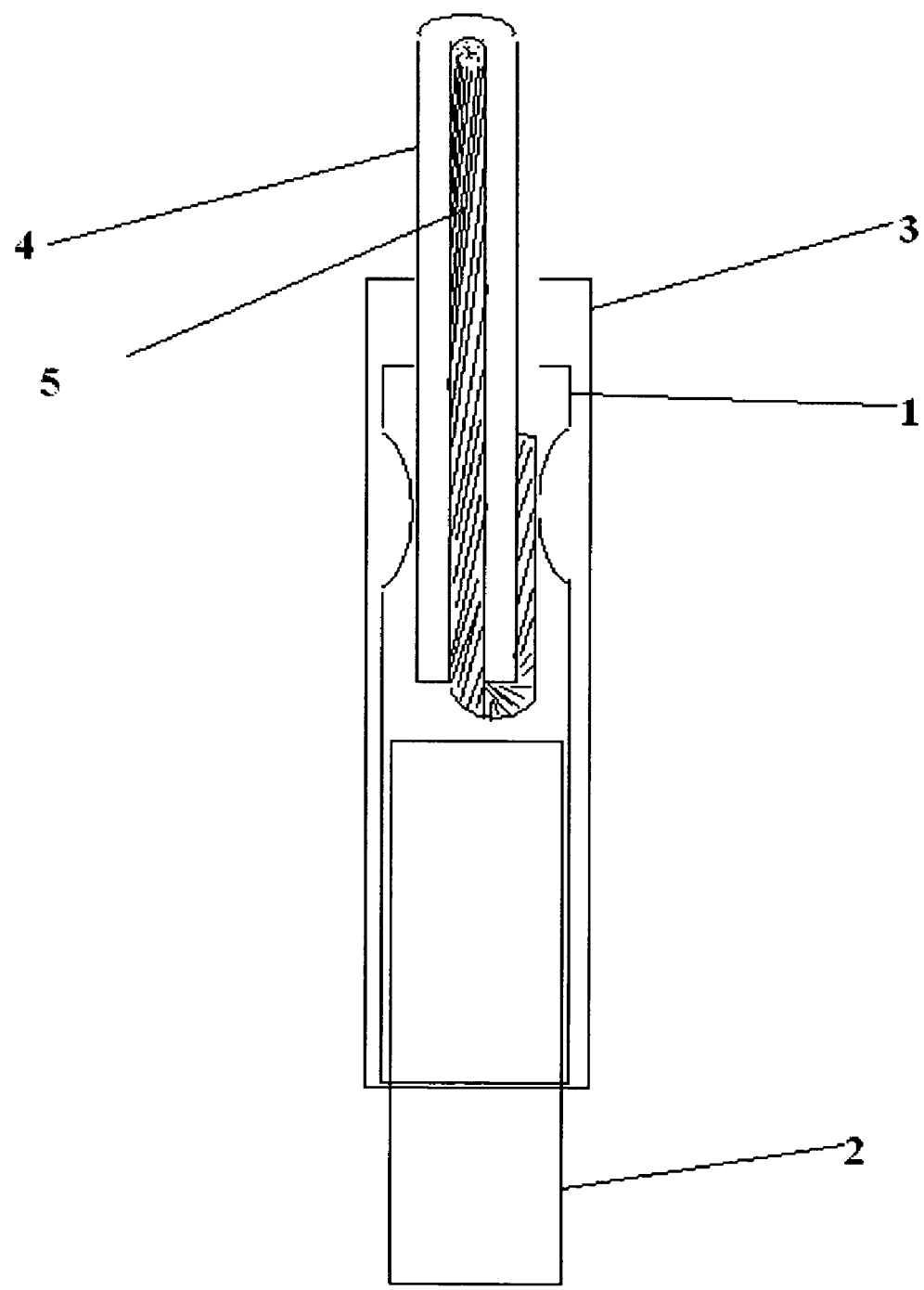
FIG. 2 is a detail view wherein the non-conductive means has been partially cut away to reveal the brass barrel underneath.
Figure 3:
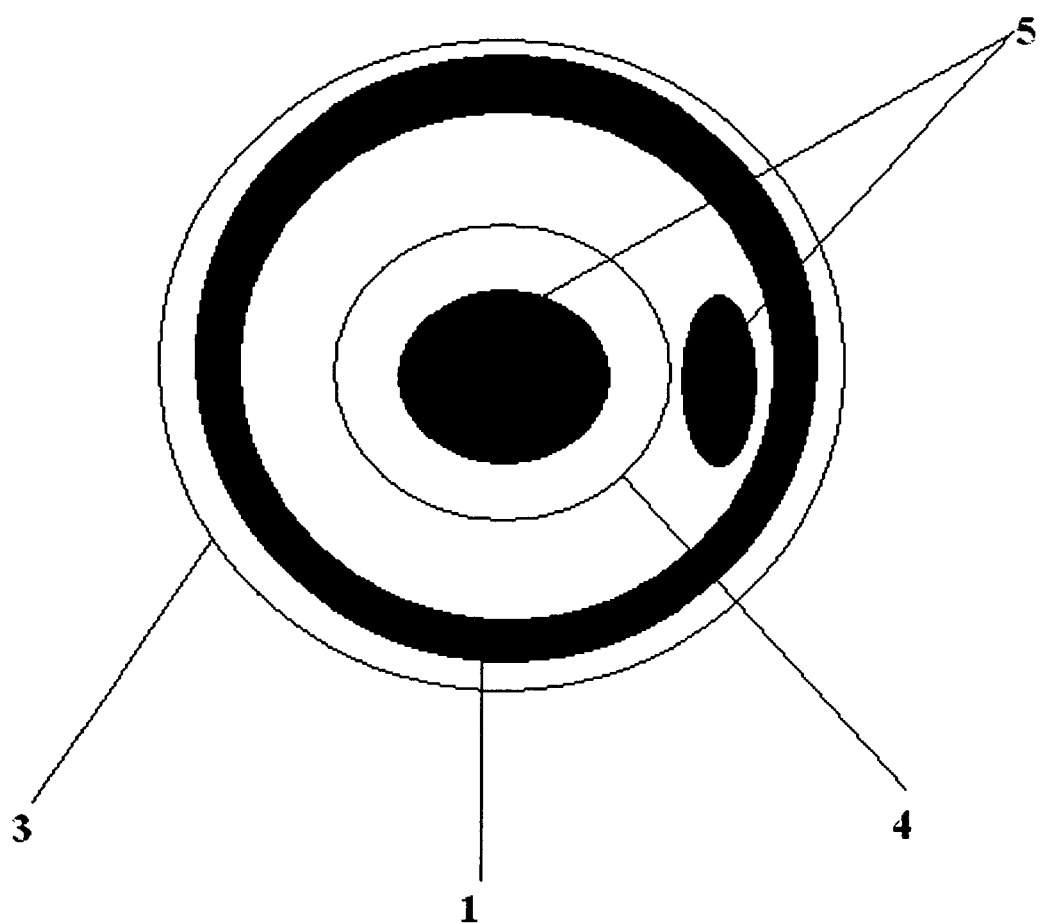
FIG. 3 is a cross-section taken along line 3-3 of FIG. 1.
Figure 4:
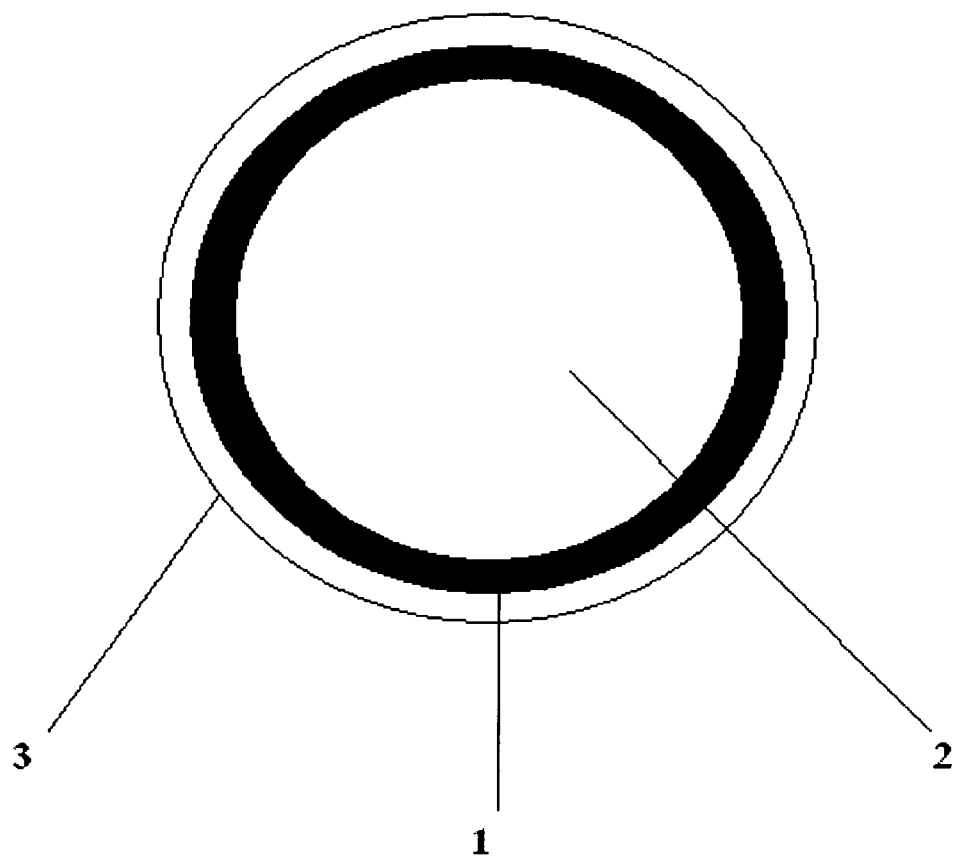
FIG. 4 is a cross-section taken along line 4-4 of FIG. 1.

In the preferred embodiment of the invention, the magnets 2 protrude from the ends of the barrels 1, as shown in FIGS. 1 and 2. This configuration is especially good for attaching the magnets 2 to recessed terminals. Common devices that have recessed terminals include sub-bases for thermostats, relays, and automation controls. Alternatively, the magnets 2 could be made so that they extend only slightly beyond the ends of the barrels 1. Either version would work for attaching the magnets 2 to exposed terminals.

The magnets 2 can be made in different sizes for different applications. For example, larger ones can be used for furnace control boards, smaller ones can be used for thermostat sub-bases, and other sizes can be used for automation and hydronic heating controls. Similarly, the length and/or diameter of the wire 4 can vary for different applications.

In the preferred embodiment of the invention, the jumper comprises one wire 4 having a magnet 2 at each end, as shown in FIG. 1. Alternatively, the jumper can be made into a three-way jumper by adding another wire and magnet in daisy chain style (Y-configuration), by connecting a second wire to the magnet 2 at one end of the first wire 4 and then adding another magnet at the opposite end of the second wire.

The magnetic jumper is suitable for use as test leads for troubleshooting low voltage circuits, up to a maximum of thirty volts or five amps current draw. The magnets 2 are not intended to remain in contact with the terminal permanently. To use the magnetic jumper, it is recommended to hold one end in each hand and place each end in contact with the desired terminal, in order to avoid having the magnets 2 adhere to each other or to unintended surfaces.

The foregoing examples were presented only by way of illustrating the best mode for carrying out the invention, and not by way of limitation, the scope of the invention being limited only by the appended claims.

We claim:

1. A magnetic jumper for bypassing electrical circuits, said jumper comprising:
    at least one wire, each of said wires having a barrel attached at each end;
    a magnet disposed at each end of each of said wires, each of said magnets being fitted into one of said barrels;
    means for non-conduction of electricity provided at each end of said wires.

2. The jumper of claim 1 wherein said jumper comprises one wire having a magnet at each end.

3. The jumper of claim 1 wherein said jumper comprises a first wire having a magnet at each end and a second wire having a magnet at each end, one of said magnets being in common on said first wire and said second wire.

4. The jumper of claim 1 wherein said magnets protrude beyond the ends of said barrels so as to allow said magnets to be attached to recessed terminals as well as to exposed terminals.

5. The jumper of claim 1 wherein said magnets extend only slightly beyond the ends of said barrels.

6. The jumper of claim 1 wherein said means for non-conduction is a molded end of non-conductive material disposed at each end of said wire.

7. The jumper of claim 1 wherein said means for non-conduction is a heat-shrink tube fitted over said barrel at each end of said wire.

8. The jumper of claim 1 wherein said means for non-conduction is a non-conductive coating applied to said barrel and to part of said wire at each end of said wire.

9. A magnetic jumper for troubleshooting low voltage terminals, said jumper comprising:
  a single conductor multi-strand wire;
  a magnet attached at each end of said wire, each of said magnets being pressed into a barrel that is crimped over said wire at each end thereof, each of said magnets protruding beyond an end of its respective barrel that is distal to said wire so as to allow each of said magnets to be adapted for temporary attachment to either a recessed terminal or an exposed terminal of a low voltage electrical circuit to provide an alternate electrical path in order to bypass said circuit for testing and troubleshooting purposes;
  means for non-conduction of electricity provided at each end of said wire, said non-conduction means being selected from a group that includes a molded end of non-conductive material, a heat-shrink tube fitted over said barrel, and a non-conductive coating applied to said barrel and to an adjacent part of said wire.

10. The magnetic jumper of claim 9 adapted to be a three-way jumper, said jumper comprising a first wire having a magnet at each end as in claim 9, and additionally having a second wire connected to said magnet at one of said ends of said first wire in a configuration known as a daisy chain or Y-configuration, said second wire having an additional magnet connected thereto at an end opposite said magnet that said second wire has in common with said first wire.

\* \* \* \* \*